US 6,729,462 B2

(12) United States Patent
Babbs et al.

(10) Patent No.: US 6,729,462 B2
(45) Date of Patent: *May 4, 2004

(54) EDGE GRIP ALIGNER WITH BUFFERING CAPABILITIES

(75) Inventors: Daniel A. Babbs, Austin, TX (US); Jae Hong Kim, Austin, TX (US); Matt W. Coady, Round Rock, TX (US); William J. Fosnight, Austin, TX (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/444,327

(22) Filed: May 22, 2003

(65) Prior Publication Data

US 2003/0196870 A1 Oct. 23, 2003

Related U.S. Application Data

(63) Continuation of application No. 09/943,555, filed on Aug. 30, 2001, now Pat. No. 6,591,960.
(60) Provisional application No. 60/230,162, filed on Sep. 1, 2000.

(51) Int. Cl.[7] ............................................. B65G 37/00
(52) U.S. Cl. ................. 198/346.2; 198/468.8; 414/936
(58) Field of Search .............................. 198/346.2, 379, 198/395, 468.8, 409, 414; 414/222.02, 223.01, 226.05, 936, 754

(56) References Cited

U.S. PATENT DOCUMENTS

| 4,685,551 | A | * | 8/1987 | Ono et al. ................. 198/346.2 |
| 5,810,935 | A | * | 9/1998 | Lee et al. .................... 414/936 |
| 6,190,103 | B1 | * | 2/2001 | Erez et al. ............. 414/222.07 |
| 6,309,163 | B1 | * | 10/2001 | Nering ........................ 414/936 |
| 6,485,248 | B1 | * | 11/2002 | Taylor, Jr. .................... 414/936 |
| 6,591,960 | B2 | * | 7/2003 | Babbs et al. ............. 198/346.2 |

* cited by examiner

*Primary Examiner*—Joseph E. Valenza
(74) *Attorney, Agent, or Firm*—O'Melveny & Myers LLP

(57) ABSTRACT

The present invention is an edge grip aligner with buffering capabilities and a method for increasing the throughput of wafers through the device. According to one embodiment, the present invention has first and second buffer arms, and a chuck arm. A workpiece can be aligned while supported on the chuck arm. Once the workpiece is aligned, the chuck arm transfers the workpiece to the buffer arms so that a second workpiece can be aligned on the chuck arm. While the second workpiece is being aligned, an end effector can transfer the first workpiece away from the buffer arms and retrieve another workpiece to place upon the chuck arm.

17 Claims, 8 Drawing Sheets

EDGE GRIP ALIGNER WITH BUFFERING CAPABILITIES

CROSS REFERENCE TO RELATED APPLICATION

The present invention is related to U.S. Pat. No. 6,478,532 entitled, "Wafer Orienting and Reading Mechanism" to Coady et al, which patent is assigned to the owner of the present invention and which patent is incorporated by reference in its entirety herein.

This application is a con of Ser. No. 09/943,555 filed Aug. 30, 2001 U.S. Pat. No 6,591,960, which claims Benefits of Priority application 60/230,162 filed Sep. 1, 2000.

BACKGROUND OF THE INVENTION

1. Field of the Invention

The present invention relates to semiconductor wafer handling and processing equipment, and in particular, to an edge grip device for reading an OCR mark on the wafer, wherein the device includes a buffer mechanism that allows a high throughput of wafers through the device.

2. Description of the Related Art

During the fabrication of semiconductor wafers, wafers are transported between the various process tools in the wafer fab in open cassettes or cassettes sealed within a pod such as a standard mechanical interface (SMIF) pod. As wafers move through the various workpiece tools, it is desirable to be able to track and locate a particular wafer at any given time. Moreover, it is desirable to be able to identify a particular wafer during wafer fabrication to ensure that the wafer is subjected only to processes appropriate for that wafer. This wafer tracking is accomplished in part by marking each wafer with an optical character recognition (OCR) mark, or similar indicial mark, which mark is read for each wafer prior to locating a wafer within a processing station. The indicial mark is typically a number or letter sequence etched into an upper and/or lower surface of a wafer near the outer circumference by a laser or other suitable etching means. The indicial mark may alternatively be a bar code or a two dimensional dot matrix at an outer circumference of the wafer.

Before an indicial mark may be read, the mark must first be located. When a wafer is seated within a wafer cassette, the orientation of the wafer to the cassette, and to a tool for extracting and supporting the wafer, is generally unknown. Attempts have been made to align the indicial mark of each wafer at a particular rotational orientation within the cassette. However, because wafers move within a cassette upon handling and transfer of the cassette between processing stations, and because the wafer is often reoriented in a process tool, alignment of the indicial marks prior to transportation has not proved feasible.

In order to locate an indicial mark, wafers are conventionally formed with a fiducial mark, such as a notch, on the outer edge of a wafer. For each wafer being processed, the indicial mark is located in a fixed, known relation to the notch, and by finding the notch, the precise location of the indicial mark may be determined. The notch is typically found by rotating the wafer under a sensor or camera so that the sensor or camera scans the outer edge of the wafer and identifies the position of the notch on the workpiece circumference. Once the notch location is found, the wafer can then be rotated to position the indicial mark under a camera (the same or different than that used to find the notch), and the indicial mark may then be read.

Another reason for rotating the wafer is to determine the radial runout of the wafer. It is important that a wafer be centered when placed to the cassette or process tool. If a wafer is off-center, it may not properly seat on a chuck of a process tool, and/or it may generate particulates by scraping against the sides of the cassette upon transfer of the wafer to the cassette. Therefore, conventionally, it is necessary to determine the radial runout of the wafer and correct it to the center position. The radial runout is a vector quantity representing the magnitude and direction by which a wafer deviates from a centered position with respect to a tool on which the wafer is seated. Once the radial runout has been determined, the wafer may be moved to a center position, or the end effector of the robot may shift to acquire the wafer on center.

Conventionally, a separate operation has been devoted to locating and reading the indicial mark on the wafer, and determining and adjusting for the radial runout of the wafer where it is desired to identify the particular wafers to be processed in that station. This operation is accomplished at a station known as an aligner. Such stations are conventionally located immediately upstream, as a stand alone unit, or as part of each tool in the wafer fabrication process where the indicial mark is to be read.

In conventional aligners, the workpiece handling robot must first transfer the wafer from the cassette to the aligner, the aligner then identifies the radial runout and notch position, the robot or aligner centers the wafer, the OCR mark is read and then the robot transfers the wafer back to the cassette. The robot sits idle while the aligner performs its operations, and the aligner sits idle while the robot transfers the wafers to and from the aligner. Conventional aligner/robot systems therefore have a relatively low throughput, on the order of approximately 300 wafers per hour. This low throughput is significant as the alignment process must be performed at each station where an indicial mark reading is required, and must be performed on each individual wafer at each of these stations. It is known to provide dual armed robots to increase throughput. However, such robots take up additional space within the tool and cleanroom, where space is at a premium. Moreover, the dual armed robots are expensive, require more complicated controls, and are relatively difficult to maintain.

It is also a significant concern for semiconductor manufacturers to avoid scratches and particulates on both sides of a semiconductor. Scratches and particulates on the front surface of the wafer can obviously damage the integrated circuit geometries. However, scratches and particulates on the back side of the wafer can also adversely effect the geometries on the front side of the wafer. In particular, scratches and particulates on the back side of the wafer can raise the top surface of the wafer when supported on a processing chuck. Changing the height of the top surface of the wafer even a slight amount can effect the depth of focus during lithography processes, and thereby adversely effect the geometries formed on the front side of the wafer.

SUMMARY OF THE INVENTION

It is therefore an advantage of the present invention to increase the throughput of workpieces processed by an aligner.

It is another advantage of the present invention that the aligner does not sit idle while the robot transfers workpieces to and from the aligner.

It is another advantage of the present invention that the robot does not sit idle while the aligner performs its operations.

It is a further advantage of the present invention to prevent scratches and particulates to the back side of a workpiece.

It is another advantage of the present invention that the aligner supports workpieces at their edge so as not to interfere with a pattern formed on the workpiece.

It is a further advantage of the present invention that the aligner provides passive support for workpieces at their edge without clamping the workpieces to the aligner.

It is another advantage of the present invention to provide an aligner capable of transferring a workpiece to an end effector of a workpiece handling robot in a desired orientation.

It is a still further advantage of the present invention to provide automatic centering of a workpiece on the aligner to allow omission of the conventional radial runout determination step and to allow omission of the sensors used to determine radial runout.

These and other advantages are accomplished by the present invention which in preferred embodiments relates to an edge grip aligner including buffering capabilities. The invention includes chuck arms for receiving a workpiece, rotating the workpiece to identify the notch location, and then positioning the workpiece so that the OCR mark on the workpiece can be read. The chuck arms then hand the workpiece off to buffer arms. Thus, a workpiece handling robot can deliver a new workpiece to the chuck arms and carry the old workpiece away in a single operation, instead of two separate operations as in the prior art.

BRIEF DESCRIPTION OF THE DRAWINGS

The present invention will now be described with reference to the drawings in which.

DETAILED DESCRIPTION

The present invention will now be described with reference to FIGS. 1–7 which in preferred embodiments relates to an edge grip aligner with buffering capabilities. The aligner according to the present invention may be seated within a workpiece tool, such as for example a process tool, sorter or metrology tool. Alternatively, the aligner may be provided as a standalone unit. It is understood that the aligner according to the present invention may be configured to operate with various workpieces, and workpieces of various sizes.

Figure 1:
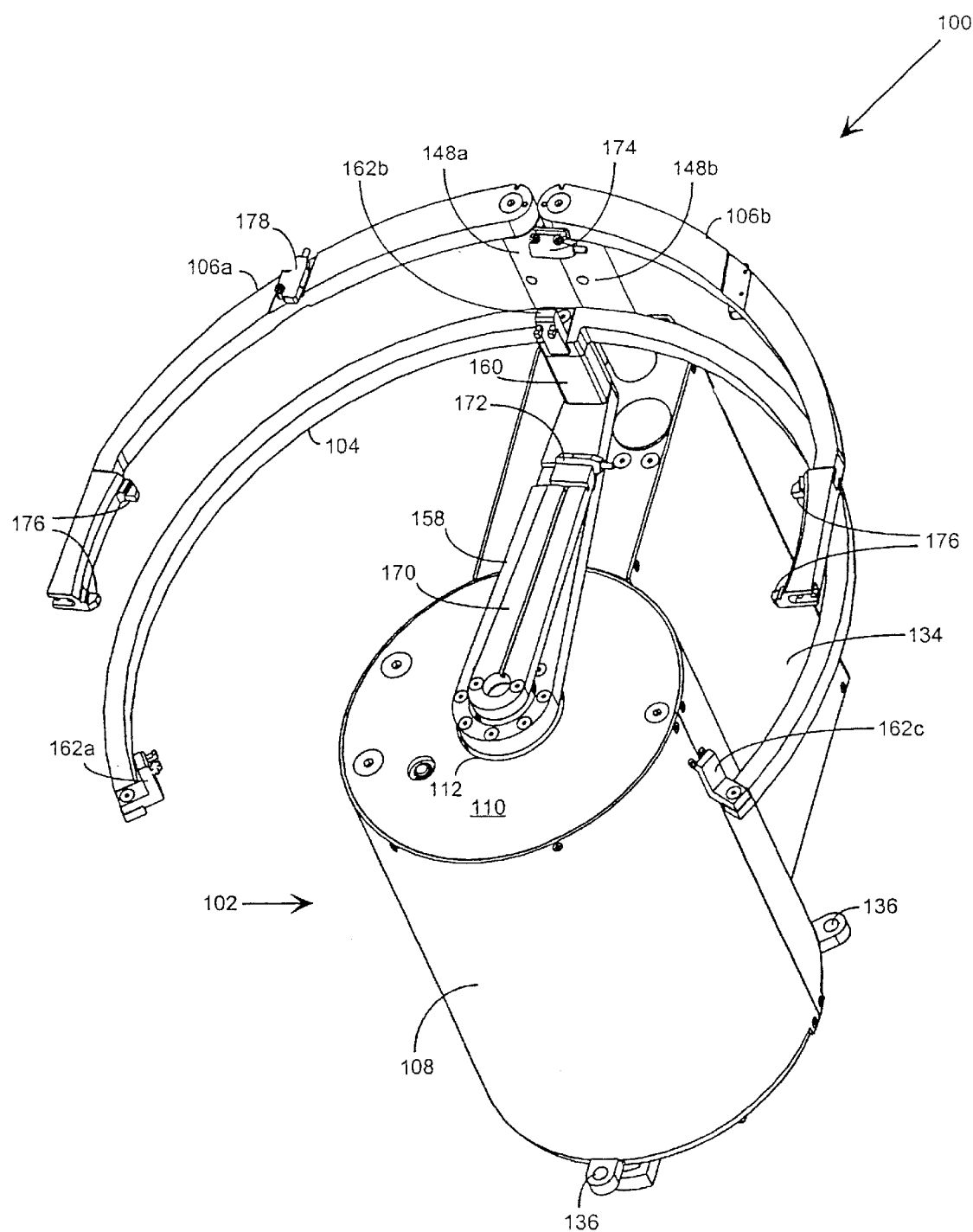
FIG. 1 is a top perspective view of an aligner according to the present invention.
Figure 2:
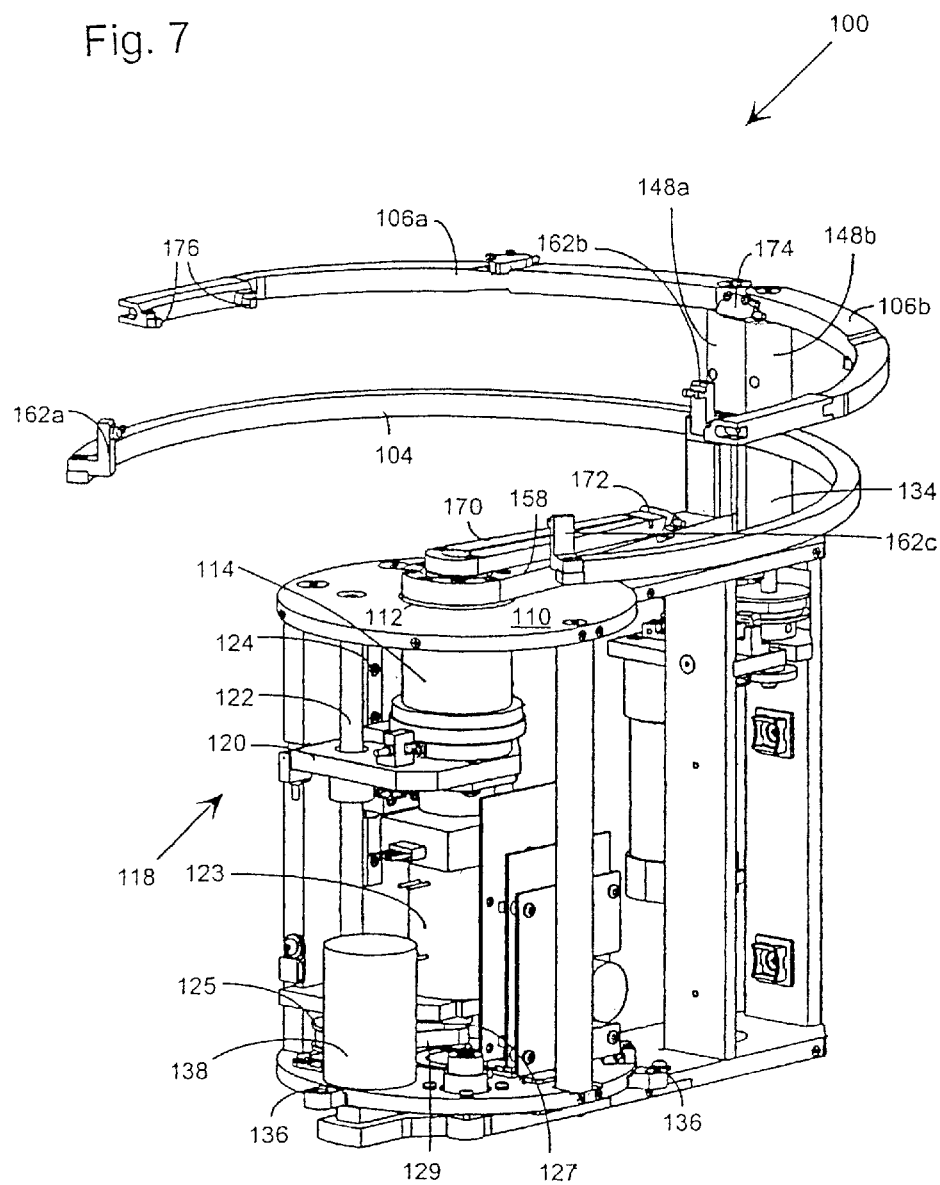
FIG. 2 is a front side perspective view of an aligner according to the present invention with the housing and buffer support stand covers removed.
Figure 3:
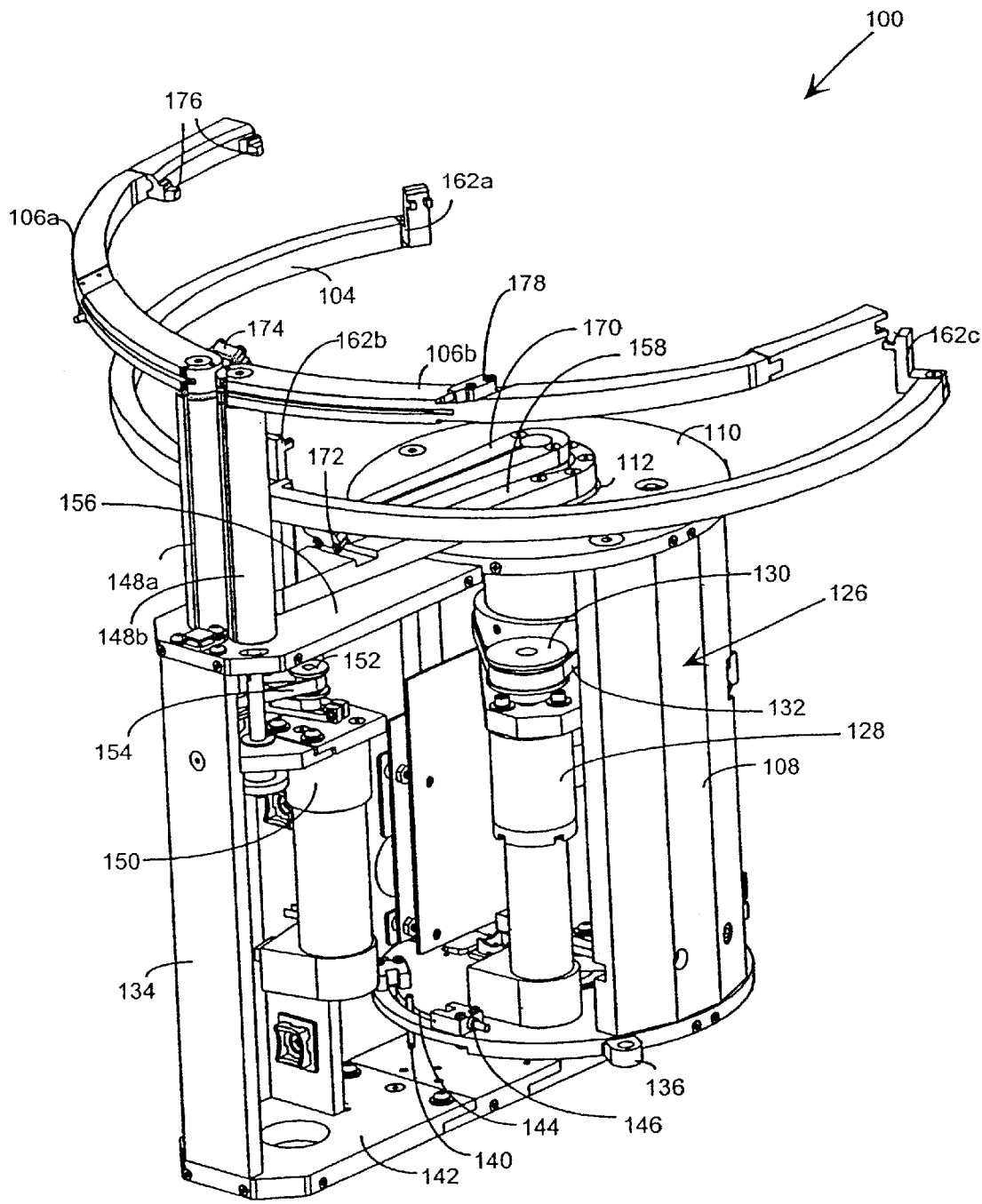
FIG. 3 is a rear side perspective view of an aligner according to the present invention with the housing and buffer support stand covers removed.

Referring to FIGS. 1–7, there is shown an edge grip aligner 100 according to the present invention including a chuck base 102, chuck arms 104, buffer support stand 134 and buffer arms 106a and 106b. Referring to FIGS. 2 and 3, the chuck base 102 is defined by a cylindrical housing 108 that encloses and protects the components within the chuck base (the housing is partially omitted from FIGS. 2 and 3 to show the internal components). The chuck base 102 further includes a top plate 110 mating with and affixed to a top portion of the housing 108. Top plate 110 includes a central hole 112 through which a mast 114 extends as explained hereinafter.

The mast is mounted to a linear drive 118 for translating the mast 114 linearly along the Z-axis. In particular, linear drive 118 includes a carriage 120 through which the mast 114 is rotationally mounted, a lead screw 122 for vertically translating the carriage 120, and a motor 123 for rotating the lead screw 122. Additionally, a rail 124 is affixed to an interior surface of the housing, and the carriage is in turn translationally affixed to the rail 124. In a preferred embodiment, the linear drive motor is preferably comprised of a brushless multiple pole motor. Brushed motors are however contemplated in alternative embodiments. Referring to FIG. 2, torque from the motor 123 is transmitted to the lead screw 122 via a pulley 125 on the lead screw, a pulley 127 on the output shaft of motor 123 and a belt 129 wrapped around the pulleys. It is understood that other torque transmission mechanisms may be used to transmit torque from the motor to the lead screw in alternative embodiments, including meshing gears and including a lead screw extending down into the motor, where is mounts directly to the armature of the motor. The motor further includes an encoder (not shown) for closed loop servo control of the motor rotation. In a preferred embodiment, the linear drive 118 is capable of translating the mast along the Z-axis approximately 1–2 inches, although it is understood the Z-axis stroke may be lesser or greater than that in alternative embodiments.

Mast 114 is preferably a hollow cylinder formed of stainless steel tubing. It is understood that the material and dimensions of mast 114 may vary in alternative embodiments. The linear drive 118 is capable of reciprocating the mast 114 so that a workpiece on the chuck arms may be transferred to the buffer arms as explained hereinafter.

The chuck arm drive 126 is provided for rotating the mast 114 and chuck arms 104. In a preferred embodiment, chuck arm drive 126 comprises a brushless motor 128, but a brushed motor may be used in alternative embodiments. A pulley 130 is affixed to an output shaft of the motor 128, and a belt 132 is affixed around the pulley 130 and mast 114 such that rotation of the motor output shaft causes rotation of the mast. The chuck arm drive 126 further includes an encoder (not shown) affixed to the output shaft to allow closed loop servo control of the mast rotation.

As would be appreciated by those of skill in the art, other torque transmission systems may be used in place of pulley 130 and belt 132 in alternative embodiments, including for example a system of gears on the output shaft and mast, which gears either mesh with each other or are coupled via a belt provided therebetween. Moreover, it is understood that the mast 114 may be mounted directly atop the motor 128 in an alternative embodiment so that the torque transmission system is omitted altogether. The chuck arm drive 126 is also mounted to the carriage 120 so as to translate with the mast 114.

Referring now to FIGS. 1–4, aligner 100 according to the present invention further includes a buffer support stand 134 rotationally mounted to a bottom surface of chuck arm base 104. The chuck arm base is in turn mounted to a floor or support surface for the aligner via bolts through bolt holes 136 (FIGS. 1–3). The aligner 100 is bolted to the floor or support surface in a slightly raised manner to allow the buffer support stand to rotate below the bottom surface of the chuck base 102 as explained hereinafter.

Figure 4:
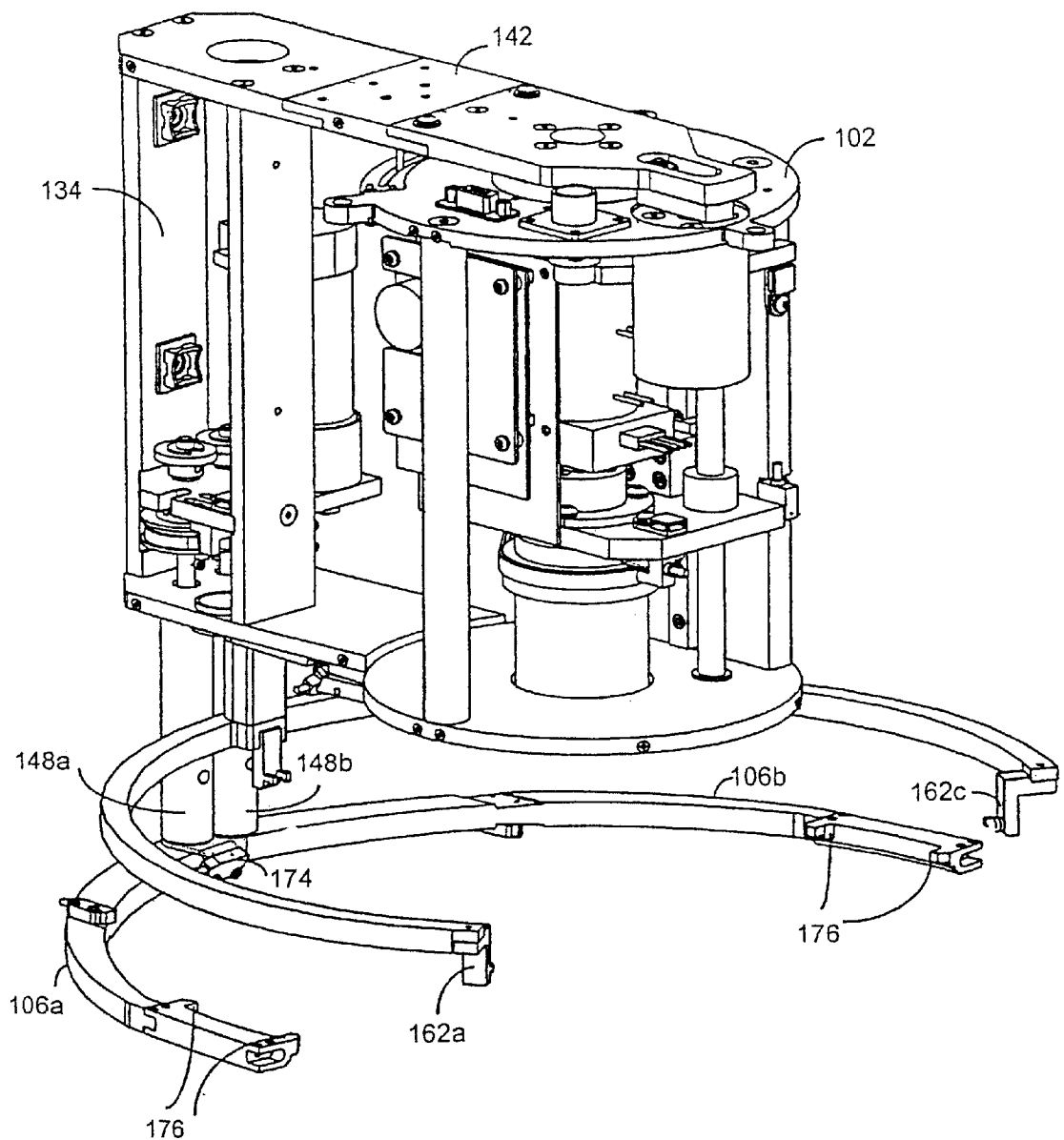
FIG. 4 is a bottom side perspective view of an aligner according to the present invention with the housing and buffer arms support stand panels removed.

As shown in FIGS. 2 and 4, a buffer rotation motor 138 is provided for rotating the buffer support stand over a small arc, for example 15°, with respect to the stationary chuck arm base. It is understood that the rotation of the buffer support stand may be greater or lesser than 15° in alternative embodiments. Motor 138 may be a brushless motor, but a brushed motor may be used in alternative embodiments. Motor 138 may further include an encoder (not shown) affixed to the output shaft to allow closed loop servo control of the buffer stand rotation. As seen in FIG. 3, a pin 140 is mounted to a base portion 142 on the buffer support stand 134, which pin 140 extends upward through a slot 144 formed in a base portion of chuck base 102. Upon rotation of the buffer support stand, a pair of sensors 146 on chuck base 102 sense when pin 140 has reached the respective ends of slot 144 to thereby stop rotation of the buffer support stand. Hard stops (not shown) may also be provided to physically prevent over rotation of the buffer support stand.

Referring for example to FIGS. 1, 2 and 3, buffer arms 106a, 106b are rotationally mounted to buffer support stand 134 via buffer arm shafts 148a, 148b. The shafts rotate buffer arms 106a, 106b between an open position where the arms are spread apart relative to each other; and a closed position where the arms are moved inward toward each other so as to be able to support a workpiece thereon. A buffer arm actuation motor 150 is mounted to the buffer support stand, which motor includes an output shaft having a pulley 152 mounted thereon. A belt 154 is in turn provided around pulley 152 and one of buffer arm shafts 148a, 148b at a lower portion of the buffer arm shaft (i.e., below a top portion 156 of the buffer support stand). It is a feature of the present invention that all components that interact in moving engagement with each other are located below the plane of the workpieces on the aligner. The buffer arm shafts 148a, 148b are interconnected via meshing spur gears (not shown) so that when motor 150 rotates one of the arms 148, the second arm rotates to an equal extent in the opposite direction. It is understood that other torque transmission mechanisms may be used in place of pulley 152 and belt 154 to transmit motor torque to the arms 148a, 148b. Moreover, it is understood that in alternative embodiments, two separate buffer arm actuation motors may be provided to independently rotate one buffer arm 148 with respect to the other.

Figure 6A:
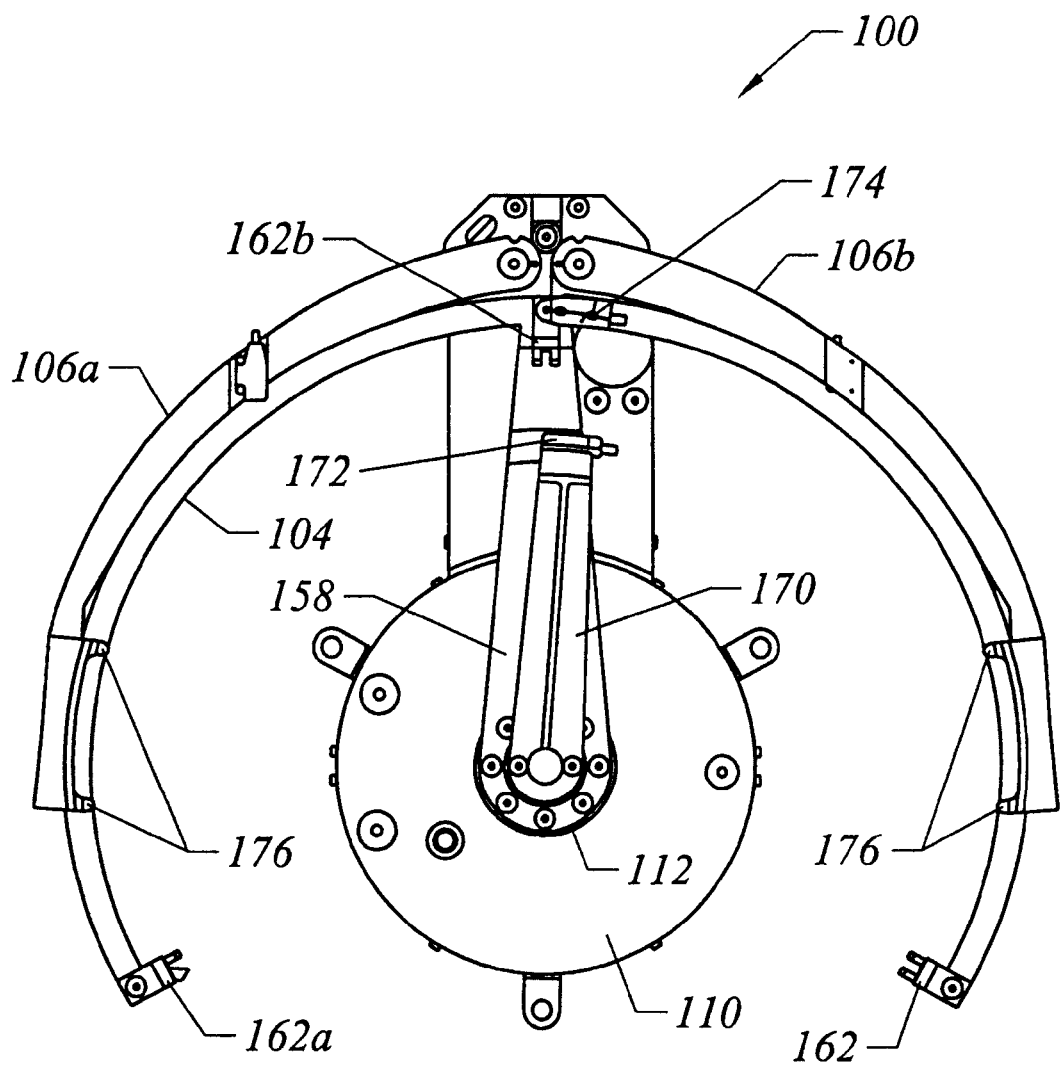
FIG. 6 is a top view of an aligner according to the present invention.
Figure 6B:
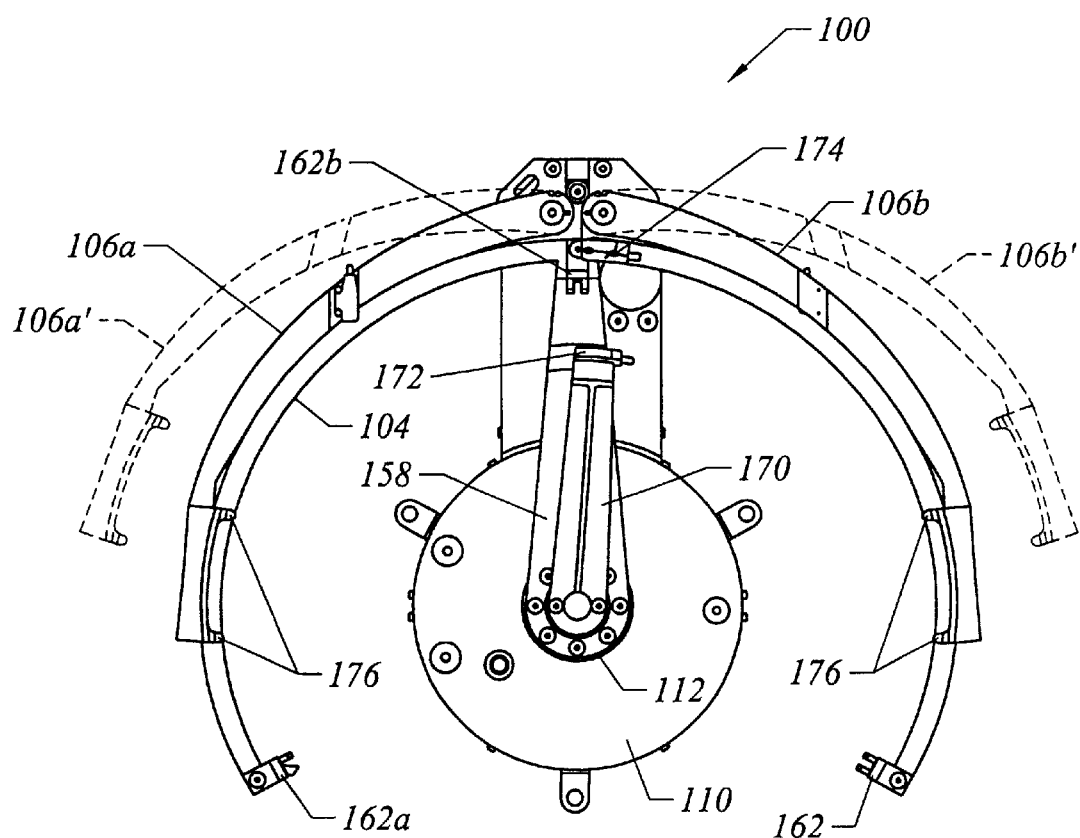
Figure 6C:
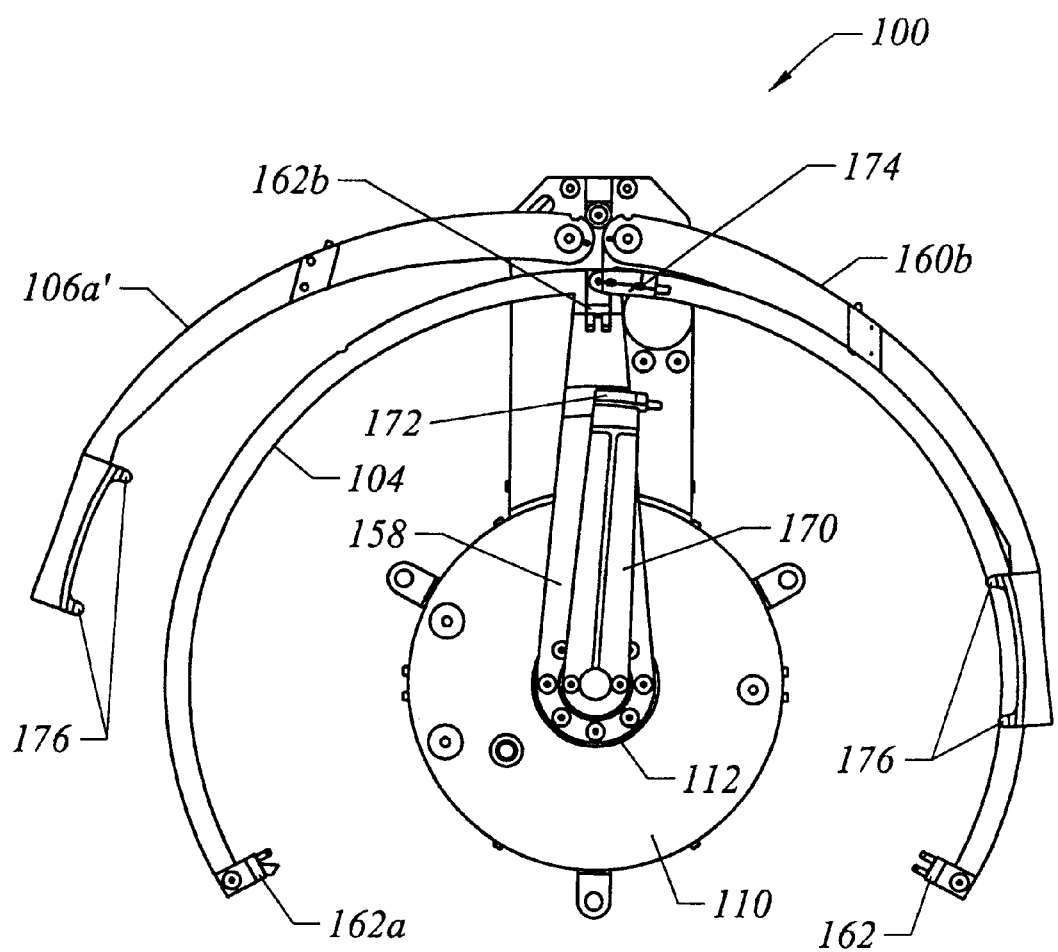

As shown in FIGS. 1, 2 and 6, a link 158 is fixedly mounted to a top portion of mast 114 above top plate 110. Chuck arms 104 are in turn fixedly mounted to link 158 via a stand off 160. Thus, chuck arms 104 translate along the Z axis with mast 114 upon actuation by linear drive 118. Chuck arms 104 also rotate with mast 114 about a central axis through mast 114 upon actuation by the chuck arm drive 126.

Chuck arms 104 are arcuately formed and include three upwardly extending fingers 162a, 162b and 162c positioned 120° apart from each other and spaced from each other so as to support a workpiece of a predetermined size. It is an advantage of the present invention that both chuck arms 104 and buffer arms 106 may be removed and replaced by alternative chuck and buffer arms to support workpieces of different sizes without having to change the various actuation mechanisms described above.

Workpieces such as semiconductor wafers conventionally include a 3 mm edge exclusion at the outer circumference of the wafer which has no pattern formed thereon. The fingers 162 are provided to support a workpiece at the edge exclusion so as to prevent any particles or scratches on the bottom surface of the workpiece, which particles and scratches can impact the depth of focus during lithography processes. It is understood that the fingers may be provided at angles other than 120° with respect to each other in alternative embodiments with the provision that the fingers be able to stably support a workpiece as the arms 104 rotate.

Figure 7:
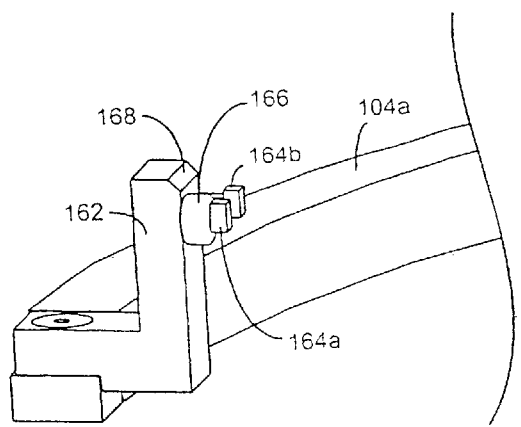
FIG. 7 is an enlarged perspective view showing a finger for supporting a workpiece in accordance with the present invention.

Referring specifically to FIG. 7, each of the fingers 162a, 162b and 162c includes a pair of workpiece support pins 164a, 164b. As indicated above, a notch is conventionally formed in the outer circumference of a workpiece to allow location and identification of an OCR mark on the workpiece. Pins 164a, 164b are spaced apart at least the length of the notch on the workpiece so that if the notch is aligned on top of one of support pins 164a, 164b upon location of a workpiece on chuck arms 104, the neighboring support pin will still support the workpiece. O-rings 166 maybe further provided over support pins 164a, 164b (only one shown for clarity) which O-rings contact and support the lower surface of the workpiece at the outer band described above. The O-rings provide a passive grip on the workpieces by static friction during rotation, and prevent generation of particulates. Conventional edge grips clamp or roll against the outer edge of a workpiece. Such clamping and rolling contact can stress the workpiece and cause microcracking, chipping, peeling, breaking and particulate generation. The passive support system according to the present invention has none of these drawbacks.

The diameter of each support pin and O-ring together is sufficiently thin so that, in the event a notch is aligned directly over a pin, the notch may still be discerned by a notch find sensor as explained hereinafter.

Each of the fingers 162a, 162b and 162c further include a downwardly sloping surface 168 so that, when a workpiece is loaded onto fingers 162, the workpiece automatically settles in a centered, identifiable position between the three fingers.

The chuck arms 104 may be formed of various rigid materials, such as for example anodized aluminum. The fingers may be formed of various rigid, low friction materials such as for example Delren®, Teflon®, PEEK, or polycarbonate.

Referring now to FIGS. 1, 2, 5 and 6, aligner 100 further includes a sensor arm 170 mounted to a shaft that extends down through the center of mast 114 and is mounted to carriage 120. Thus, sensor arm 170 translates along the Z axis with mast 114, link 158 and arms 104, but sensor arm 170 remains stationary as mast 114, link 158 and arms 104 rotate. A receiver 172 is mounted on an end of the sensor arm which cooperates with a transmitter 174 to sense a notch in the workpiece as explained hereinafter. It is understood that the respective positions of receiver 172 and transmitter 174 may be reversed in alternative embodiments.

As explained above, buffer arms 106a and 106b are mounted to buffer arm shafts 148a and 148b so as to rotate between open and closed positions. Buffer arms 106a, 106b are arcuately shaped and include four workpiece supports 176 positioned on the arms and spaced from each other so as to support a workpiece when the buffer arms are in a closed position. It is understood that the number and position of workpiece supports 176 may vary in alternative embodiments with the provision that they are able to stably support a workpiece when in the closed position. The arms are preferably formed of rigid materials such as for example anodized aluminum, and the supports are preferably formed of a rigid, low friction material such as for example Delren®, Teflon®, PEEK or polycarbonate.

As indicated above, a transmitter 174 is mounted to one of the buffer arms, and directs a beam to the receiver on the end of sensor arm 170. As is known in the art, the transmitter and receiver together may form a break-the-beam sensor capable of detecting the position of the notch on the edge of the workpiece, to thereby allow identification of the OCR mark on the workpiece. As would be appreciated by those of skill in the art, other sensor systems may be used to detect the notch.

The operation of the aligner 100 will now be described with reference to FIGS. 1–7. With the mast 114 and chuck arms 104a in the lowered position, the end effector of a conventional wafer handling robot may enter in between the chuck arms and buffer arms and lower the workpiece on to fingers 162a, 162b and 162c. As explained hereinafter, it is a further feature of the present invention to provide adequate space above and below chuck arms 104 to allow stacked end effectors of a dual paddle end effector to enter above or below the chuck arms 104. As indicated above, sloping surface 168 automatically centers the wafers between the fingers, and the separate step of identifying radial runout conventionally performed may be omitted. Moreover, the sensor systems conventionally used for identifying radial runout may also be omitted.

Once the workpiece is seated on fingers 162, chuck arm drive 126 rotates chuck arms 104 and the workpiece seated thereon. As the chuck arms have an axis of rotation through the center of the mast, and as the workpiece is centered on fingers 162, the axis of rotation of the workpiece seated on the arms 104 should be substantially through the center of the workpiece. The arms are capable of rotating the workpiece at least 360°. At some point during rotation of the workpiece, the transmitter 174 and receiver 172 detect the notch in the outer circumference of the workpiece.

During this notch find operation, the buffer arms 106a and 106b are preferably in the closed position so that transmitter 174 is positioned to transmit to receiver 172. It is understood that in an alternative embodiment, the transmitter 174 maybe mounted on an independent post so that the buffer arms 106 can be in either the open or closed position during the notch find operation. As indicated above, if the notch is located over one of the support pins 164 on a finger 162, the workpieece will be supported on the second pin of the pair on that finger, and the workpiece is still stably supported at at least three points.

Once the notch is found, the workpiece is further rotated on chuck arms 104 to position the OCR mark adjacent a mark reading device such as a charge couple display (CCD) camera. Alternatively, the OCR mark may be positioned adjacent the camera when the notch is detected and no further rotation of the workpiece is necessary to read the mark after the notch has been located. The OCR mark may be located on a top and/or bottom side of the workpiece. The CCD camera is therefore positioned over and/or under the workpiece, depending on where the OCR mark is. In any event, the CCD camera is positioned so as not to interfere with any moving parts of aligner 100. It is also contemplated in alternative embodiments that the aligner include multiple transmitter/receiver sets similar to transmitter 174 and receiver 172 spaced around the lengths of the chuck and buffer arms. Such multiple sensors reduce the maximum angle through which a workpiece must be rotated to locate the notch.

Figure 5:
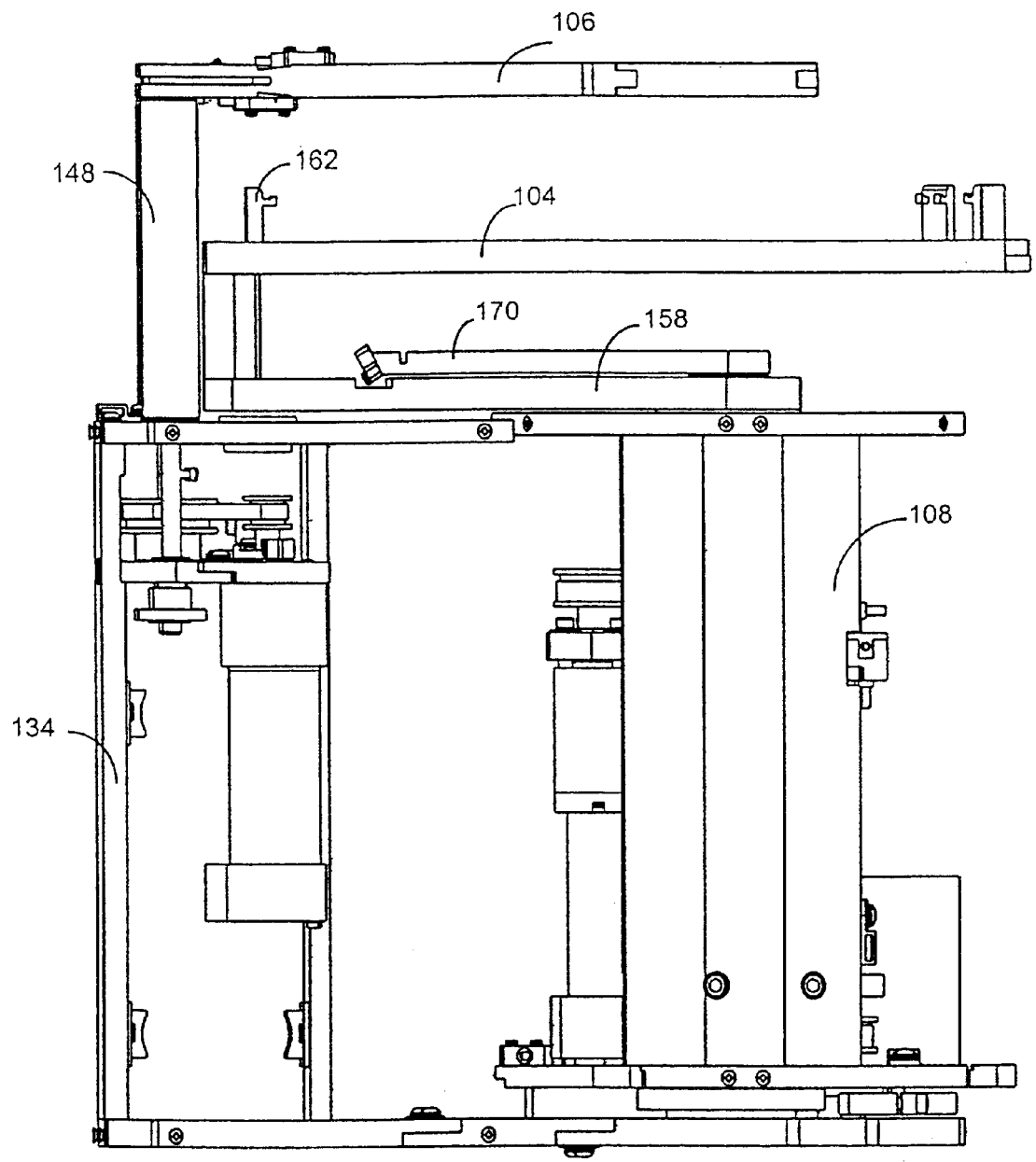
FIG. 5 is a side view of an aligner according to the present invention with the housing and buffer support stand panels removed.

Once the OCR mark is read, linear drive 118 raises the workpiece to a horizontal plane above that occupied by buffer arms 106a, 106b. If the buffer arms are in a closed position during the notch find operation, the arms are opened prior to the workpiece being raised to ensure no interference between the workpiece and the buffer arms. After the workpiece has been raised above the plane of the buffer arms, the buffer arm actuation motor 150 moves buffer arms 106a, 106b to their closed position, and the workpiece is transferred from the chuck arms to the buffer arms by lowering the workpiece off of fingers 162 and onto the workpiece supports. The fingers extend upward so that the workpiece may be located in a plane above the buffer arms while the chuck arms remain below the buffer arms. Thus, no interference between the chuck and buffer arms occurs during workpiece transfer. As shown in FIG. 5, and partially in FIGS. 1–4, a sensor 178 may be provided on one or both buffer arms 106a, 106b to detect the presence of a workpiece supported on the buffer arms. Sensor 178 may be any of various known sensors, such as for example a break-the-beam sensor or retroflective sensor.

While the aligner 100 according to the present invention is performing a notch find operation and the workpiece is being transferred from the chuck arms to the buffer arms, the workpiece transfer robot acquires a new workpiece. By the time the robot returns with a new workpiece, the first workpiece has been transferred to the buffer arms. The new workpiece is deposited on the fingers 162 which have again lowered to their bottom position, the end effector withdraws, raises up, and acquires the old workpiece from the buffer arms. The old workpiece is then carried away from the aligner 100.

The aligner 100 according to the present invention cycles through the above-described steps to continuously identify OCR marks on workpieces as desired. It is understood that the above-described steps may be modified in alternative embodiments so that, instead of delivering to the chuck arms and acquiring from the buffer arms, a workpiece robot can deliver workpieces to the buffer arms and acquire from the chuck arms.

In situations where the OCR mark is located on a bottom of the workpiece, it may happen that when a workpiece is transferred to the chuck arms 104, the OCR mark may be covered by the link 158. This situation will be identified by the control system upon location of the workpiece notch, i.e., as the chuck arms 104 rotate the workpiece, if the notch is identified when the chuck arms are at a particular known orientation, that will indicate to the control system that the OCR mark is located directly above one of the link 158 and potentially cannot be read by the CCD camera. When the control system detects this situation, after locating the notch, the workpiece is handed off from the chuck arms to the buffer arms, the chuck arms rotate to a position clear of any interference, and reacquire the workpiece for reading by the CCD camera.

In certain situations, it is desirable to return a workpiece from an aligner in a known and uniform orientation to the end effector, workpiece carrier or next station. The present invention can accomplish this by, after reading the OCR mark, rotating the workpiece to a desired orientation and handing the workpiece off to the buffer arms so that the end effector may reacquire the workpiece in this known orientation. However, after reading the OCR mark and rotating the workpiece on the chuck arms to the desired orientation, it may happen that one or more of the fingers 162 align directly under one or more of the workpiece supports 176. This alignment will prevent proper hand-off of the workpiece from the chuck arms to the buffer arms. Therefore, in accordance with further aspects of the present invention, the buffer support stand 134 maybe rotated over an arc of approximately 15° by buffer rotation motor 138 as explained above to prevent interference upon hand-off. In particular, after orienting the workpiece in the desired position, the control system can identify if the chuck arms in this position would interfere with the buffer arms upon hand-off. If an interference position is detected, the buffer support stand 134 is rotated to change the orientation of the buffer arms so that the workpiece may be handed off without interference. Once the workpiece is handed off, the buffer arms remain in the rotated position so that the workpiece may be transferred to the workpiece handling robot in the desired orientation. The buffer support stand can then rotate back to its home position. An alternative embodiment which does not require the buffer support stand to rotate includes a static wafer pedestal concentrically mounted within the chuck arms. The wafer pedestal provides support for the wafer, thereby allowing the chuck arms to rotate the fingers under the wafer with respect to the notch. In this embodiment, notch detecting sensors are attached to the chuck arm fingers so as to determine the notch location during chuck arm rotation. After the chuck arms successfully reorient the fingers with respect to the notch, the chuck arms lift to re-engage the wafer and elevate it for placement to the buffer arms as previously described.

It is a feature of the present invention that space is provided both above and below the chuck arms 104 so that the stacked end effector can maneuver (i.e., enter, exit, fan out, fan together) both above and below the chuck arms 104.

The use of buffer arms 106 provides advantages in throughput in that the robot does not sit idle while the aligner is identifying the OCR mark, and the aligner does not sit idle while the robot is acquiring a new workpiece. Throughput may be further improved by using the aligner 100 in accordance with the present invention together with a parallel processing system utilizing a stacked end effector. Such an end effector is described in U.S. patent application Ser. No. 09/547,551 entitled "System for Parallel Processing of Workpieces" to Babbs et al., which application is assigned to the owner of the present invention, and which application is incorporated by reference herein in its entirety. As disclosed in that application, a robot including a stacked end effector can work with a pair of aligners 100 in accordance with the present invention. The aligners 100 are located adjacent to each other such that, for example, the stacked end effector can position two workpieces over the fingers of the first aligner. Thereafter, with one of the end effectors remaining stationary, the second end effector can fan out to position the second workpiece over the fingers of the second aligner. After the workpieces are deposited on the fingers of the respective aligners, the end effectors can withdraw, raise up, and acquire the workpieces from the buffer arms on the two aligners. Thereafter, the second end effector can rotate to once again align over the first end effector and the workpieces can be carried away from the aligners. Instead of moving to the aligners and then fanning out, it is also contemplated that the end effector can fan out and then move to the aligners so that the workpieces are positioned over the fingers on the respective aligners at the same time.

In the above described process using both the stacked effector and aligners 100, two workpieces may be processed while two other workpieces are in transit to or from the aligners so that operations are taking place on four workpieces simultaneously. Such a system is able to process over 600 workpieces per hour. This is more than twice the throughput of robot and aligner systems of conventional design.

Although the invention has been described in detail herein, it should be understood that the invention is not limited to the embodiments herein disclosed. Various changes, substitutions, and modifications can be made thereto by those of skill in the art without departing from the spirit or scope of the invention.

What is claimed is:

1. A processing tool, comprising:
   first and second buffer arms, said first and second buffer arms adapted to move between an open position and a closed position where said first and second buffer arms are capable of supporting a workpiece;
   a chuck arm adapted to rotate a workpiece substantially about the geometric center of the workpiece; and
   a chuck arm drive system adapted to move said chuck arm between a first position in which a workpiece seated on said chuck arm is located above said first and second buffer arms and a second position in which a workpiece seated on said chuck arm is located below said first and second buffer arms.

2. The processing tool according to claim 1, wherein said first and second buffer arms may rotate independently.

3. The processing tool according to claim 1, wherein only one of said first and second buffer arms rotates between said open and closed positions.

4. The processing tool according to claim 1, wherein said chuck arm has three upwardly extending fingers respectively positioned 120° apart from each other.

5. The processing tool according to claim 4, wherein each one of said three upwardly extending fingers support a workpiece along an edge exclusion area.

6. The processing tool according to claim 5, wherein said three upwardly extending fingers have a downwardly sloping surface that contacts the workpiece.

7. The processing tool according to claim 6, wherein the workpiece automatically settles in a centered, identifiable position between the fingers.

8. The processing tool according to claim 1, wherein said first and second buffer arms and said chuck arm are arcuately shaped.

9. An processing tool, comprising:
   first and second arms adapted to rotate between an open position and a closed position in which said first and second arms are capable of supporting a workpiece;
   a third arm having three upwardly extending fingers respectively positioned 120° apart from each other, each one of said three upwardly extending fingers includes a downwardly sloping surface that contacts the peripheral edge of the workpiece seated on said third arm, said third arm adapted to rotate in order to align the workpiece seated on said third arm; and
   a drive system adapted to move said third arm between a first position in which a workpiece seated on said third arm is located above said three upwardly extending fingers and a second position in which a workpiece seated on said thirdchuck arm is located below said three upwardly extending fingers.

10. A processing tool for aligning and storing substantially flat workpieces, each substantially flat workpiece having a top and bottom surface, the processing tool comprising:
   a first and second buffer arm adapted to rotate between an open position and a closed position, said first and second buffer arms having workpiece supports adapted to support a workpiece in a substantially horizontal orientation when said first and second buffer arms are located in said closed position;

a chuck arm having means for supporting the workpiece in a substantially horizontal orientation; and a chuck arm drive, said chuck arm drive adapted to rotate said chuck arm in order to align the workpiece and move said chuck arm between a first position in which the bottom surface of the workpiece seated on said chuck arm is located above said first and second buffer arms and a second position in which the bottom surface of the workpiece seated on said chuck arm is located below said first and second buffer arms.

11. The processing tool according to claim 10, wherein said means for supporting the workpiece comprises three fingers respectively positioned 120° apart from each other.

12. The processing tool according to claim 11, wherein each one of said three upwardly extending fingers support the workpiece along an edge exclusion area.

13. A method for aligning a workpiece, comprising the steps of:

(a) placing the workpiece on a first support;

(b) aligning the workpiece by rotating the first support while the workpiece remains seated upon the first support;

(c) transferring the workpiece from the first support onto a second support by vertically raising the first support until the workpiece is located above the second support and subsequently lowering the first support until the workpiece is supported by the second support;

(d) returning the first support to a position located below the second support; and (e) placing a second workpiece onto the first support while the first workpiece is seated upon the second support.

14. The method according to claim 13, further comprising the steps of:

(f) removing the first workpiece from said second support.

15. A method for sequentially processing workpieces using a first support and a second support, comprising the steps of:

(a) placing a first workpiece on the first support;

(b) processing the first workpiece by rotating the workpiece seated on the first support substantially about the center of the workpiece;

(c) transferring the first workpiece from the first support to the second support by initially raising the first support until the workpiece is located above the second support and subsequently lowering the first support until the workpiece is seated on the second support;

(d) placing a second workpiece on the first support after the first support returns to a position located below the second support; and (e) processing the second workpiece.

16. The method according to claim 15, further comprising the step of:

(f) placing a third workpiece onto the second support after the first workpiece is removed from the second support;

(g) removing the second workpiece from the first support;

(h) transferring the third workpiece from the second support; and (i) processing the third workpiece while a fourth workpiece is placed onto the second support.

17. A processing tool, comprising:

a storage mechanism having a first and second buffer arm, said first and second buffer arms adapted to pivot between an open position and a closed position in which said storage mechanism is capable of supporting a workpiece;

an operational arm, said operational arm adapted to rotate in order to align a workpiece seated on said operational arm; and an operational arm drive adapted to move said operational arm between a first position in which a workpiece seated on said operational arm is located above said first and second buffer arms and a second position in which a workpiece seated on said operational arm is located below said first and second buffer arms.

* * * * *